United States Patent
Nicolino, Jr. et al.

(10) Patent No.: US 9,461,606 B2
(45) Date of Patent: Oct. 4, 2016

(54) SYSTEMS AND METHODS FOR AUTOMATIC SIGNAL ATTENUATION

(71) Applicant: Adaptive Sound Technologies, Inc., San Jose, CA (US)

(72) Inventors: Sam J. Nicolino, Jr., Cupertino, CA (US); Ira Chayut, Los Gatos, CA (US); Kuo Hsiung Wu, San Jose, CA (US)

(73) Assignee: Adaptive Sound Technologies, Inc., San Jose, CA (US)

( * ) Notice: Subject to any disclaimer, the term of this patent is extended or adjusted under 35 U.S.C. 154(b) by 57 days.

(21) Appl. No.: 14/482,645

(22) Filed: Sep. 10, 2014

(65) Prior Publication Data

US 2015/0263688 A1  Sep. 17, 2015

Related U.S. Application Data

(60) Provisional application No. 61/954,369, filed on Mar. 17, 2014.

(51) Int. Cl.
*H03G 3/32* (2006.01)
*H04R 1/10* (2006.01)
*H03G 3/00* (2006.01)

(52) U.S. Cl.
CPC ............. *H03G 3/32* (2013.01); *H04R 1/1041* (2013.01); *H04R 2201/109* (2013.01); *H04R 2420/07* (2013.01); *H04R 2430/01* (2013.01); *H04R 2460/03* (2013.01); *H04R 2460/07* (2013.01)

(58) Field of Classification Search
CPC .................. H03G 3/32; H04R 1/1041; H04R 2201/109; H04R 2420/07; H04R 2430/01; H04R 2460/03; H04R 2460/07

USPC .............................................. 381/57, 104–107
See application file for complete search history.

(56) References Cited

U.S. PATENT DOCUMENTS 5,838,269 A * 11/1998 Xie .................... H03M 1/185
341/118
2004/0008848 A1   1/2004 Krochmal et al.
(Continued)

FOREIGN PATENT DOCUMENTS

GB      1568105 A  *  5/1980   ............. H03G 1/007
GB      1568105 A      5/1980
(Continued)

OTHER PUBLICATIONS

"International Application Serial No. PCT/US2015/020526, International Search Report mailed Jun. 24, 2015", 2 pgs.
(Continued)

*Primary Examiner* — Vivian Chin
*Assistant Examiner* — Ammar Hamid
(74) *Attorney, Agent, or Firm* — Schwegman Lundberg & Woessner, P.A.

(57) ABSTRACT

The systems, devices, and methods provided herein can be used with an audio source to automatically attenuate a signal from the audio source in response to information about a local environment. In an example, an attenuation network circuit can be used to provide automatic or "hands-free" adjustment of a headphone or headset volume level to compensate for changing background sound or noise levels. In relatively noisy environments, the attenuation network can provide little or no attenuation of an audio source signal, and in less noisy environments, the attenuation network can provide greater attenuation of the audio source signal.

21 Claims, 6 Drawing Sheets

(56) References Cited

U.S. PATENT DOCUMENTS

| | | | |
|---|---|---|---|
| 2006/0108992 A1* | 5/2006 | Pruvost | H03G 3/3052 323/281 |
| 2011/0029109 A1 | 2/2011 | Thomsen et al. | |
| 2013/0081560 A1* | 4/2013 | Peery | A47B 13/08 108/160 |

FOREIGN PATENT DOCUMENTS

| | | | | |
|---|---|---|---|---|
| GB | 2289583 A | | 11/1995 | |
| GB | 2289583 A | * | 11/1995 | H03G 3/32 |
| WO | WO-2013/081560 A1 | | 6/2013 | |
| WO | WO 2013081560 A1 | * | 6/2013 | A61N 1/3785 |
| WO | WO-2015142659 A1 | | 9/2015 | |

OTHER PUBLICATIONS

"International Application Serial No. PCT/US2015/020526, Written Opinion mailed Jun. 24, 2015", 9 pgs.

"International Application Serial No. PCT/US2015/020526, International Preliminary Report on Patentability mailed Mar. 30, 2016", 7 pgs.

* cited by examiner

SYSTEMS AND METHODS FOR AUTOMATIC SIGNAL ATTENUATION

CLAIM OF PRIORITY

This application claims the benefit of priority under 35 U.S.C. §119(e) of Nicolino et al., U.S. Provisional Patent Application Ser. No. 61/954,369, entitled "SYSTEMS AND METHODS FOR AUTOMATIC SIGNAL ATTENUATION", filed on Mar. 17, 2014, which is herein incorporated by reference in its entirety.

BACKGROUND

Mobile devices, such as portable music players, gaming devices, and mobile computers or telephones, among other devices, are configured to generate, play back, or otherwise provide an audio signal using a speaker or an audio signal output port. A user-operated audio volume control can be provided to adjust an amplitude of the audio signal reproduced by the speaker or provided at the audio signal output port. The audio volume control can be integrated with the mobile source device and configured for manual operation by a user. The user-operated audio volume control can include a knob, button, slider, touchscreen feature, or other physical interface that can receive an input from a user and, in response, provide a control signal to an audio amplifier circuit or audio attenuator circuit to change the audio signal amplitude.

An audio signal can be processed in other ways to enhance a user's listening experience. For example, a mobile device can include a "loudness" feature that can adjust one or more frequency components of an audio signal, such as to subjectively improve a user's perception of the frequency content of the signal. A mobile device can include other frequency filters, such as to enhance intelligibility of an audio signal, such as by adjusting signal frequency components that correspond to the human voice range.

Another technique for enhancing a user's listening experience can include active noise reduction or noise cancelling. An active noise-cancelling device, such as a headphone device, can receive an audio signal of interest from an audio source device and can receive information about an ambient noise signal. The active noise-cancelling device can include circuitry that can cancel or attenuate a low frequency component of the ambient noise signal that is not part of the audio signal of interest. The effectiveness of a noise-cancelling device can be limited, and can depend on factors that are external to the audio source device, such as the bandwidth or frequency content of the ambient noise signal.

OVERVIEW

The present inventors have recognized, among other things, that a problem to be solved can include automatically adjusting an audio signal, such as from an audio source device, in response to a sensed change in an environment. For example, the problem can include using a device to automatically adjust a volume or amplitude of an audio signal, such as for reproduction using headphones, based on information about a change in an ambient noise level. The present inventors have further recognized that a problem to be solved can include automatically adjusting an audio signal using an ultra-low power circuit. The present subject matter can help provide a solution to these problems, such as by sensing an environment parameter, and operating an attenuation network circuit configured to process an audio signal. In an example, the attenuation network circuit can be substantially passive, and can be operated in response to a sensed environment parameter. The sensed environment parameter can include, among other things, an indication of an environmental or ambient noise level, a user location, or other information received from another device in the local environment.

The present subject matter can include an apparatus that can be inserted in an audio signal path between an audio signal source device and an audio signal output destination device. The apparatus can include an audio signal input configured to receive an audio signal from the audio signal source device, and the apparatus can include an audio signal output configured to provide a processed or attenuated audio signal, such as to an audio signal output destination device, based on the received audio signal. The apparatus can include an environment sensor configured to sense an environment parameter, and an attenuation network circuit (or other signal processor circuit) that is coupled to the audio signal input and the audio signal output. The apparatus can include, or can be communicatively coupled to, a processor circuit that is configured to update an attenuation magnitude characteristic of the attenuation network circuit using information about the sensed environment parameter from the environment sensor.

The present subject matter can include a system, device, or method for providing automatic or "hands-free" adjustment of a headphone or headset volume level to compensate for changing background sound or noise levels. In relatively noisy environments, the attenuation network circuit can be configured to provide little or no attenuation for an audio signal of interest, and in quieter environments, the attenuation network circuit can be configured to more substantially attenuate the audio signal of interest.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

Figure 1:
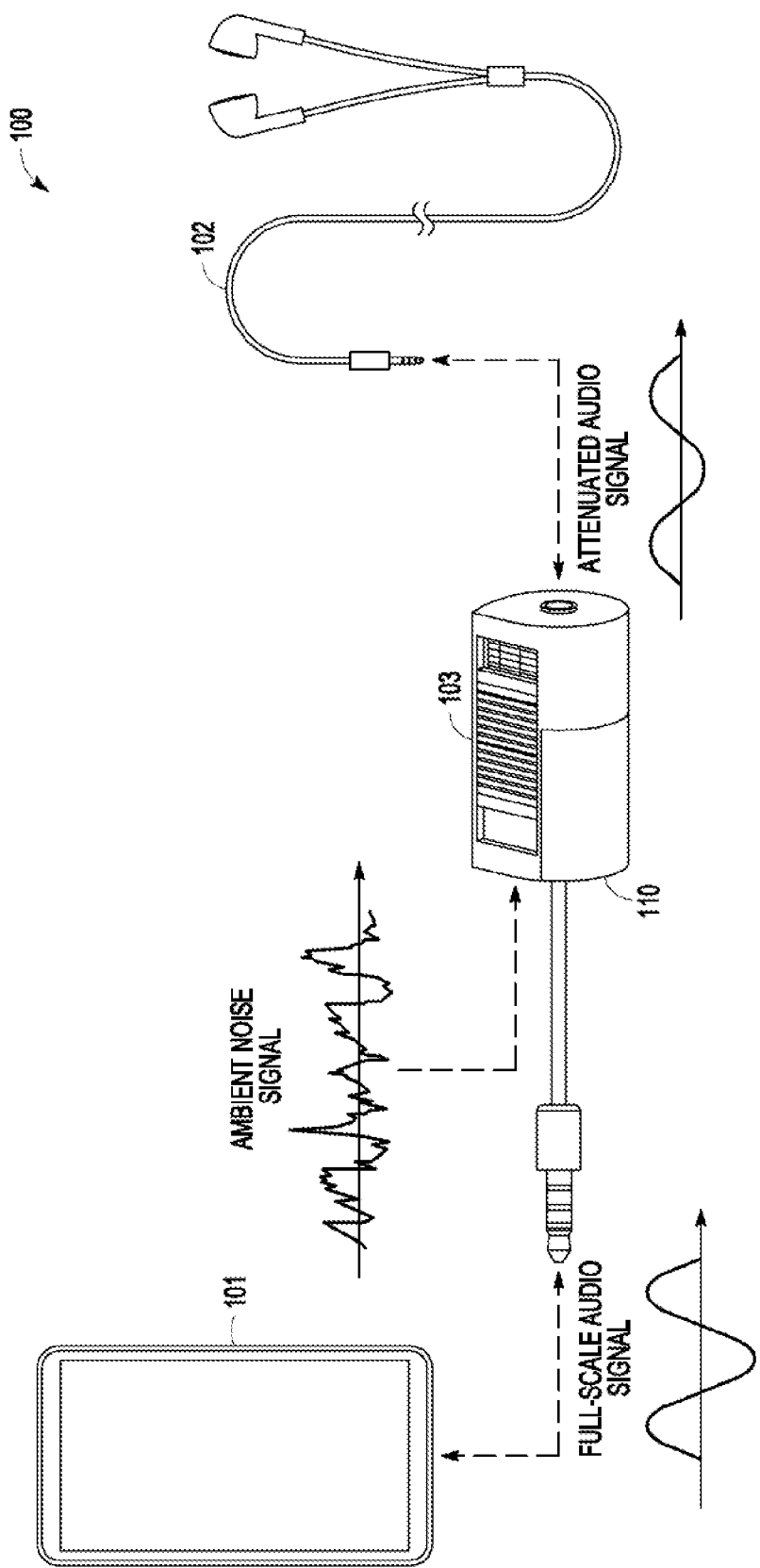
FIG. 1 illustrates generally an example of a signal processing system that includes an automatic signal attenuation device.

FIG. 1 illustrates generally an example of a signal processing system 100 that includes an automatic signal attenuation device 110. The signal attenuation device 110 can receive an audio signal from an audio signal source device 101, process the received audio signal, and provide a processed audio signal to an audio signal output destination device 102. Generally, any audio-generating or audio signal-transmitting source can be used as the source device 101, and any listening, reproduction, or other signal-transmitting device can be used as the destination device 102. In the example of FIG. 1, the source device 101 is a mobile telephone, and the destination device 102 is a pair of headphones. Other source and destination devices can similarly be used.

The attenuation device 110 can provide automatic or "hands-free" adjustment of one or more parameters of an audio signal received from the source device. The adjustment can be based on a user-selected attenuation profile, a sensed ambient sound pressure level, or other user-selected criteria. For example, the attenuation device 110 can receive a full-scale audio source signal from the source device 101, and in response, the attenuation device 110 can provide an attenuated audio signal to the destination device 102. The attenuation device 110 can use sensed information about an environment parameter, such as an ambient noise level or ambient sound pressure level, and information from a user input 103, to provide the attenuated audio signal. For example, when the sensed information about the environment parameter indicates a noisy environment, the signal provided at the output of the attenuation device 110 can be minimally attenuated, that is, the signal can have a relatively large amplitude. When the sensed information about the environment parameter indicates a quiet environment, the signal provided at the output of the attenuation device 110 can be attenuated to reduce the signal amplitude.

The attenuation device 110 can be employed by a user, such as someone who listens to audio from a portable music or cell phone device, while the user moves through environments having different background sound or noise levels. An example includes a user who encounters or passes through multiple different environments during a commute, such as moving from a noisy street to a quiet elevator, or a user such as a jogger or bicyclist who may rapidly encounter different environments, such as when passing from a noisy, high-traffic thoroughfare to a quieter side street. The attenuation device 110 can optionally be employed by a user who is listening to radio, television, or other media through headphones, or by a user who talks on a cell phone through a headset, such as while a level of background sound changes.

A background sound pressure level, or other information that can be sensed about the environment, can be received from an environment sensor that is included in one or more of the source device 101, the attenuation device 110, or the destination device 102. For example, the environment sensor can include a microphone configured to sense an ambient sound pressure level. The microphone can be included in any one of the source device 101, the attenuation device 110, or the destination device 102. In some examples, more than one environment sensor can be used, and the multiple environment sensors can be configured to sense information about the same or different environment parameter.

The user input 103 can receive information from a user about a desired operating criteria for the attenuation device 110. In the example of FIG. 1, the user input 103 includes a slider. Although a slider is shown in FIG. 1, the user input 103 can include any means for receiving information from a user about the desired operating criteria. For example, the user input 103 can include a knob, dial, switch, touchscreen, or other system or device for receiving information from the user. Information from the user input 103 can optionally be quantized or discretized, for example using a processor included within the attenuation device 110, for use in processing the audio signal. In some examples, the user input 103 includes indicia that provide information to the user about which of one or more available settings is presently selected. The indicia can include, among other things, printed alpha-numeric characters, pictorial information, or tactile information (e.g., different raised or recessed portions of the user input 103).

Given a particular sensed environment parameter value, information from the user input 103, such as from the slider in FIG. 1, can influence an amount of attenuation applied to the source signal using the attenuation device 110. Some of the possible operating states of the attenuation device 110, including various user input 103 states, are illustrated below in Table 1. In the first column of Table 1, the "User Input Status" corresponds to a position or input value at the user input 103. In the slider in the example of FIG. 1, the User Input Status can be set to "Bypass", which corresponds to the slider positioned at one end or extent of its available travel. In "Maximum Attenuation", the slider is positioned at the opposite end of its travel, and in "Intermediate Attenuation" the slider is positioned between the ends of its travel.

TABLE 1

Example of Attenuation Device Operating States

| USER INPUT STATUS | AMBIENT NOISE LEVEL | OUTPUT SIGNAL |
| --- | --- | --- |
| BYPASS: NO ATTENUATION | LOW | = INPUT SIGNAL |
| | HIGH | = INPUT SIGNAL |
| INTERMEDIATE ATTENUATION | LOW | = INTERMEDIATE ATTENUATION OF INPUT SIGNAL |
| | HIGH | = MINIMUM ATTENUATION OF INPUT SIGNAL |

TABLE 1-continued

Example of Attenuation Device Operating States

| USER INPUT STATUS | AMBIENT NOISE LEVEL | OUTPUT SIGNAL |
| --- | --- | --- |
| MAXIMUM ATTENUATION | LOW | = MAXIMUM ATTENUATION OF INPUT SIGNAL |
| | HIGH | = MINIMUM ATTENUATION OF INPUT SIGNAL |

As shown in Table 1, in Bypass mode, the attenuation device 110 can be configured to provide an output signal that is substantially the same as the input signal, such as regardless of an ambient noise level. In some examples, the attenuation device 110 can process the input signal or apply one or more other signal filters when the device is in Bypass mode.

In Maximum Attenuation mode, the output signal depends on the ambient noise level. For example, when the ambient noise level is high, the attenuation device 110 can minimally attenuate the input signal such that a maximum amplitude signal is passed from the source device 101 to the destination device 102. That is, in an example where the attenuation device 110 includes a passive attenuation network circuit, the passive attenuation network can be bypassed to provide a maximum signal at the destination device 102. When the ambient noise level is low, however, the attenuation device 110 can maximally attenuate the input signal such that a minimum amplitude signal is passed from the source device 101 to the destination device 102. Thus, in Maximum Attenuation mode, the user or listener can experience a relatively wide variation between audio signals provided at the output of the attenuation device 110 in response to different ambient noise levels.

In Intermediate Attenuation mode, the output signal similarly depends on the ambient noise level. For example, when the ambient noise level is high, the attenuation device 110 can minimally attenuate the input signal such that a maximum amplitude signal is passed from the source device 101 to the destination device 102, as described above for the Maximum Attenuation mode. When the ambient noise level is low, the attenuation device 110 can partially attenuate the input signal such that a signal having an intermediate amplitude is passed from the source device 101 to the destination device 102. Thus, in Intermediate Attenuation mode, the user or listener can experience some variation between audio signals provided at the output of the attenuation device 110 in response to different ambient noise levels.

In some examples, the sensitivity of the response of the attenuation device 110 to the ambient noise level can be controlled by a user, such as using the same or different user input 103. When the sensitivity of the response is high, a small change in an ambient noise level can correspond to large change in the attenuation characteristic of the attenuation device 110. Conversely, when the sensitivity of the response is low, a large change in the ambient noise level can correspond to a small change in the attenuation characteristic.

Other response characteristics of the attenuation device 110 to the ambient noise level, or to a change in the ambient noise level, can be adjustable by a user or can be pre-set. For example, an attenuation update attack rate, or an attenuation update release rate, can be adjustable or pre-set. In an example, in response to a user input, the rate at which the attenuation of the source signal is implemented can be adjusted. That is, in response to a change in an environment parameter, the rate at which the attenuation characteristic of the attenuation device 110 changes is adjustable by a user. In some environments, a noise level can be relatively constant, such as when a user is on a train with long periods of travel between stops. In some environments, the noise level can be dynamic, such as when a user is on a bus with shorter periods of travel between stops, corresponding to more intermittent or dynamic noise levels. The user of the attenuation device 110 can optionally adjust how quickly an attenuation characteristic of the device changes to compensate for the various environments. For example, the train-riding user can select a relatively slow update attack rate because the user may only want the attenuation characteristic to change when the train comes to a stop, or as the train gradually becomes more noisy (e.g., as more passengers board or with increased speed). The user on a bus can select a relatively quick update attack rate because the user may want to ensure that he or she hears an audio signal during the more frequent stops and starts of the bus.

The attenuation update attack rate and release rate can be adjusted as a unit, as an attenuation hysteresis characteristic. The attenuation hysteresis characteristic can be configured to control a rate at which the attenuation device 110 updates its attenuation magnitude, such as to avoid oscillating or throbbing, in response to incremental changes in the environment.

In an example, an audio signal compression ratio, loudness characteristic, or other frequency equalization characteristic can be adjustable by a user or can be pre-set. In an example, in response to a user input, the attenuation device 110 can be configured to process or shape an audio source signal to subjectively enhance the listener's perception of the signal at the destination device 102. In an example, one or more of the compression ratio, loudness, or other frequency equalization characteristic can be automatically changed in response to different levels of attenuation. For example, when the attenuation device 110 is operating at a maximum attenuation, a first loudness profile can be applied to the source signal, and when the attenuation device 110 is operating at a minimum attenuation, a different second loudness profile (e.g., optionally including no frequency-shaping profile), can be applied to the source signal.

In an example, an audio source signal type can be specified by a user or can be detected automatically by the attenuation device. In an example, in response to a user input, the attenuation device 110 can be configured to process or shape the audio source signal to subjectively enhance the listener's perception of the signal, at the destination device 102, according to the selected or detected audio source signal type. For example, one or more of the compression ratio, loudness, or other frequency equalization characteristic can be automatically changed in response to a detected spoken word signal, such as to increase intelligibility of the signal content for the user. In an example, a first attenuation characteristic can be applied for a music signal, such as in response to a first detected environment noise level, and a second attenuation characteristic can be applied for a spoken word signal, such as in response to the same first detected environment noise level.

The example of FIG. 1 illustrates a wired system in which the source device 101, the attenuation device 110, and the destination device 102 are physically coupled using wired connections. In other examples, one or more of the source device 101 and the destination device 102 can be wirelessly coupled to the attenuation device 110, such as using Bluetooth or using some other wireless communication protocol suitable for transmitting an audio signal.

Figure 2:
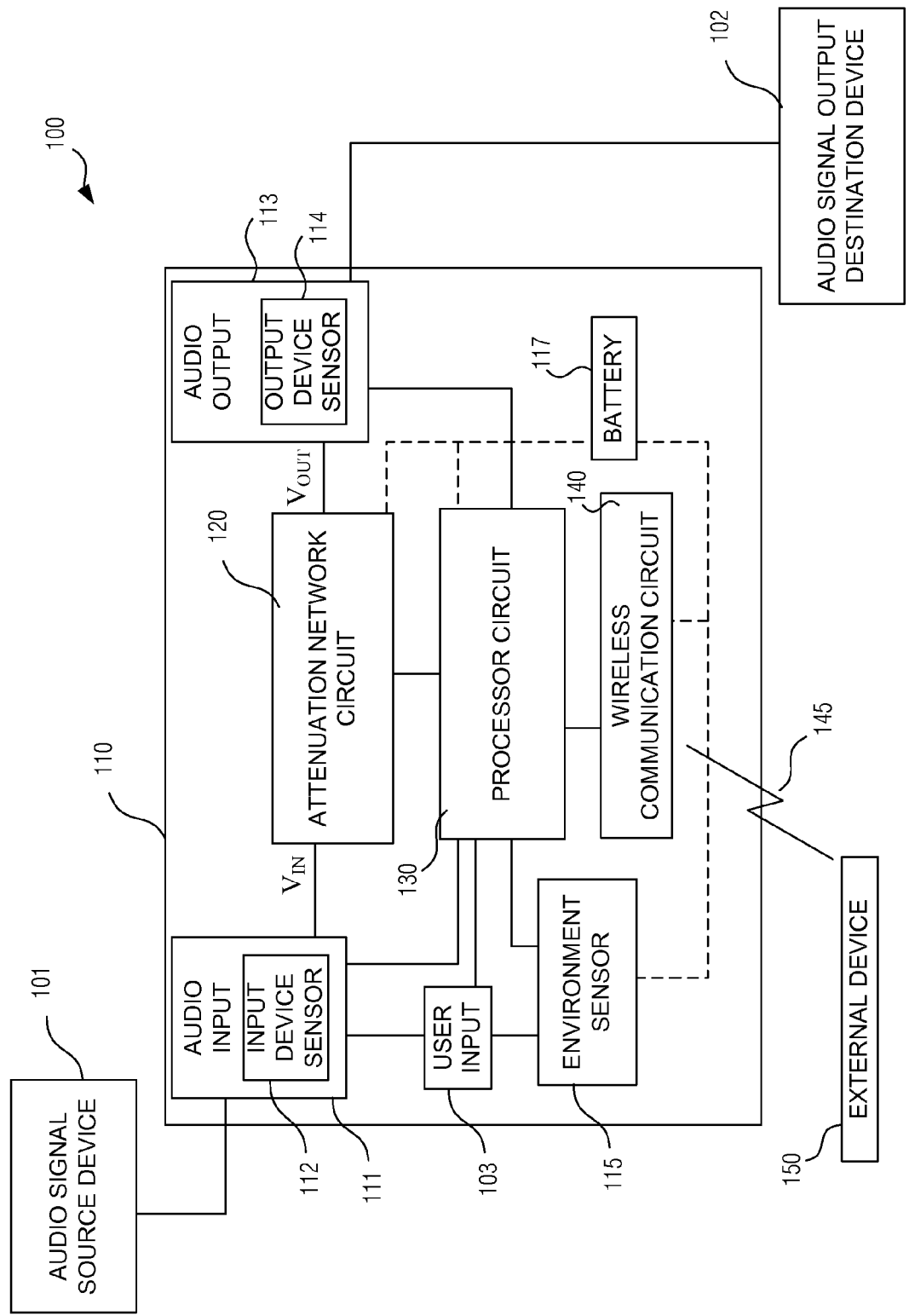
FIG. 2 illustrates generally a block diagram of an example of a signal processing system that includes an automatic signal attenuation device.

FIG. 2 illustrates generally a block diagram of an example of a signal processing system that includes the automatic signal attenuation device 110. The attenuation device 110 includes an audio input 111, an audio output 113, and an attenuation network circuit 120 in the audio signal path between the audio input 111 and the audio output 113. The attenuation network circuit 120 can include a substantially passive resistive network configured to selectively attenuate a portion of one or more signals received from the audio input 111. The attenuation device 110 includes a processor circuit 130 that is configured to receive information from one or more of the user input 103, the audio input 111, the audio output 113, and an environment sensor 115, and the processor circuit 130 is configured to provide attenuation characteristic information to the attenuation network circuit 120 based on the received information.

The audio input 111 includes a physical hardware port or a software port that is configured to receive an analog or a digital audio signal. In an example, the audio input 111 includes a ⅛" TRS plug or other male audio adapter, as in the example of FIG. 1, and is configured to be used with the audio signal source device 101. Many commonly available audio signal source devices 101, such as cellular telephones, MP3 players, or portable movie players, include ⅛" stereo receptacles that are configured to receive headphones or a transmission line to transmit an audio signal to a playback device, such as a desktop stereo. Other hardware devices can similarly be used as the audio input 111, including a ¼" TRS or TS interface, a USB interface, an optical interface, or other plug or receptacle.

In the example of FIG. 1, the audio input 111 includes a plug on a wire that extends from the housing of the attenuation device 110. The wire can have a sufficient length such that when the plug is inserted into the audio signal source device, the base unit can be disposed outside of a user's pocket, backpack, or other carrying mechanism. In an example of the attenuation device 110 that includes an integrated microphone as the environment sensor 115, the attenuation device 110 can be positioned such that the microphone can receive information about the ambient noise level around the attenuation device 110. In some examples, an extension wire is not included, and the audio input 111 plug is directly attached to the housing of the attenuation device 110, and in some examples, the extension wire is retractable within the housing of the attenuation device 110. In an example, the attenuation device 110 is integrated with a headphone or headset device and can be worn, such as at an ear or headband portion of the headphone or headset, or the attenuation device 110 can be substantially integrated in-line with a wire connecting an audio signal source device 101 to the headphone or headset.

The audio input 111 can be generally configured to receive an audio input signal in the range of tens to hundreds of millivolts. The audio input 111 optionally includes an input device sensor 112 that can provide information, such as to the processor circuit 130, about whether the audio signal source device 101 is coupled to the audio input 111. For example, the input device sensor 112 can be configured to monitor whether an impedance is present between two or more of the conductors at the audio input 111. When an impedance (e.g., within a specified range) is detected, the input device sensor 112 can provide a signal to the processor circuit 130 to indicate that a device is present. When an open circuit is detected, or an impedance outside of a specified impedance range is detected, the input device sensor 112 can provide a signal to the processor circuit 130 to indicate that a device is not present. In an example, the attenuation network circuit 120 can be opened when the input device sensor 112 is queried, such as to avoid contaminating the sensor information with any signal or stray impedance information from elsewhere in the attenuation device 110. In an example, the audio input 111 can be configured to wirelessly receive audio information, such as in analog or digital form, from an external source device.

The audio output 113 includes a physical hardware port or a software port that is configured to provide an analog or a digital audio signal for use by the audio signal output destination device 102. In an example, the audio output 113 includes a ⅛" TRS receptacle or other female audio adapter, as in the example of FIG. 1, that is configured to be used with the audio signal output destination device 102. Many commonly available audio signal output destination devices 102, such as headphones, speaker systems, or other processing equipment, include ¼" or ⅛" stereo (TRS) plugs. The audio output 113 can be generally configured to provide an audio output signal in the range of tens to hundreds of millivolts, based on the audio input signal at the audio input 111.

The audio output 113 optionally includes an output device sensor 114 that can provide information, such as to the processor circuit 130, about whether the audio signal output destination device 102 is coupled to the audio output 113. For example, the output device sensor 114 can be configured to use information about an impedance between two or more of the conductors at the audio output 113 to provide a signal to the processor circuit 130 to indicate that a device is or is not present. In an example, the audio output 113 can be configured to wirelessly provide audio information, such as in analog or digital form, to an external destination device.

In an example, one or both of the audio input 111 and the audio output 113 are configured with a TRRS plug and a TRRS receptacle for interfacing with a source device or headphones with an integrated microphone. A signal from the integrated microphone can be passed through the attenuation device 110 unchanged, or the signal from the integrated microphone can be used, at least in part, as the environment sensor 115.

A timer circuit can optionally be used in coordination with one or both of the input device sensor 112 and the output device sensor 114. For example, the input device sensor 112 can monitor a signal amplitude level at the audio input 111. When the signal amplitude level is less than a specified signal threshold amplitude, such as determined using one of the input device sensor 112 or the processor circuit 130, a count or time interval can be initiated using the timer circuit. If a signal amplitude level that is greater than the threshold amplitude is detected within some specified duration, based on information from the timer circuit, then the input device sensor 112 can provide a signal to the processor circuit 130 to indicate that the audio signal source device 101 is present. If a signal amplitude level that is greater than the threshold amplitude is not detected within the specified duration, then the input device sensor 112 can provide a signal to the processor circuit 130 to indicate that the audio signal source device 101 is not present. In an example, the attenuation device 110 can enter an off or sleep state when the audio signal source device 101 is determined to be not present.

The environment sensor 115 can include a sensor device that is configured to sense an environment parameter and, in response, provide a signal indicative of the sensed environment parameter. In some examples, the environment sensor 115 can provide quantized or discretized information about the sensed environment parameter.

In an example, the environment sensor 115 includes a microphone. The microphone can be a passive, moving-coil type microphone, or the microphone can be a low power, active electret or piezoelectric microphone, or the microphone can be a microelectromechanical system (MEMS microphone). The microphone can be positioned on a housing of the attenuation device 110 to receive information about a sound pressure level in the vicinity of the attenuation device 110. In some examples, the microphone can include one or more passive or active filters, and a filtered microphone signal can be provided to the processor circuit 130 for further analysis or processing. For example, the microphone can include a low pass filter configured to pass only relatively low frequency information to the processor circuit 130.

In an example, the microphone diaphragm can be recessed from a housing surface of the attenuation device 110 to influence a frequency response characteristic of the microphone. In an example, the microphone can be omnidirectional. In some examples, the directionality of the microphone can be adjusted, such as by a user, to influence a sensitivity of the sound pressure level information detected by the microphone. The directionality of the microphone can be adjusted using one or more air louvers in the housing of the attenuation device 110.

The environment sensor 115 can be coupled to a rectifier circuit, or the environment sensor 115 can be configured to provide a rectified signal. In an example, the rectifier circuit can receive an AC signal as the signal indicative of the sensed environment parameter and, in response, provide a rectified signal indicative of the sensed environment parameter. One or more characteristics of the rectified signal can be identified, such as using the processor circuit 130, including an average, RMS, peak, or minimum characteristic of the signal. The one or more characteristics can be used by the processor circuit 130 to influence the attenuation network circuit 120.

The environment sensor 115 can additionally or alternatively include sensors other than a microphone. For example, the environment sensor 115 can include a GPS or other positioning signal sensor. In response to receiving information from the GPS or other positioning signal sensor that indicates that the attenuation device 110 is located in a generally noisy environment, such as in an airport terminal, or traveling on an expressway, the processor circuit 130 can automatically adjust the attenuation network circuit 120.

In an example, the environment sensor 115 can include an optical or visual sensor that is configured to recognize one or more features of an environment. In response to receiving information from the optical or visual sensor that indicates that the attenuation device 110 is located in a generally noisy environment, the processor circuit 130 can automatically adjust the attenuation network circuit 120.

The environment sensor 115 can include an accelerometer, altimeter, or other motion or position-sensitive sensor. In response to receiving information from the motion or position-sensitive sensor that indicates that the attenuation device 110 is moving in a particular manner or at a particular rate, such as when the attenuation device 110 is used in a vehicle such as a train or car, the processor circuit 130 can automatically adjust the attenuation network circuit 120.

The attenuation device 110 can include an attenuation network circuit 120. In an example, the attenuation network circuit 120 can include an active network circuit, such as a digital circuit configured to adjust a signal magnitude for a digital audio signal. In an example, the attenuation network circuit 120 can include a low power, passive network circuit, such as an analog circuit configured to adjust a signal magnitude for an analog audio signal.

In an example that includes a passive circuit network, the attenuation network circuit 120 receives an input voltage signal $V_{IN}$, processes the input voltage signal $V_{IN}$ using one or more resistive devices, and provides an output voltage signal $V_{OUT}$. In this example, the attenuation network circuit 120 includes multiple resistive devices, and each resistive device can be selectively inserted or removed from the audio signal path using a corresponding switching device, such as to modify an attenuation magnitude characteristic of the attenuation network circuit 120. Signals configured to control respective ones of the corresponding switching devices can be provided by the processor circuit 130. The attenuation network circuit 120 is further described in the discussion of FIG. 3.

The processor circuit 130 in the attenuation device 110 can include a software module (e.g., code embodied (1) on a non-transitory machine-readable medium or (2) in a transmission signal) or a hardware-implemented module. A hardware-implemented module can include a tangible unit capable of performing various, programmable operations. In some examples, one or more computer systems (e.g., including a standalone, target or server computer system) or one or more processor circuits may be configured by software (e.g., an application or application portion) as a hardware-implemented module that operates to perform operations as described herein.

In some examples, the hardware-implemented module can be implemented mechanically or electronically. For example, the hardware-implemented module can include dedicated circuitry or logic that is permanently configured, for example, as a special-purpose processor circuit, such as a field programmable gate array (FPGA) or an application-specific integrated circuit (ASIC), to perform specified operations. The hardware-implemented module can include programmable logic or circuitry (e.g., as encompassed within a general-purpose processor or other programmable processor) that can be temporarily configured by software to perform certain operations. The decision to implement a hardware-implemented module mechanically, in dedicated and permanently configured circuitry, or in temporarily configured circuitry (e.g., configured by software) may be driven by cost and time considerations.

The various operations and methods described herein may be performed, at least partially, by one or more processor circuits that are temporarily configured (e.g., by software) or permanently configured to perform the relevant operations. Whether temporarily or permanently configured, such processor circuits may constitute processor-implemented modules that operate to perform one or more operations or functions. The performance of certain ones of the operations described herein can optionally be distributed among two or more processor circuits, not only residing within a single machine, but deployed across a number of machines, such as including a portion in the attenuation device 110, and in a device communicatively coupled with the attenuation device 110.

In an example, the processor circuit 130 includes a microcontroller having a non-transitory memory circuit, a RAM circuit, multiple input and output data ports, and one or more analog-to-digital converter circuits. In an example, the processor circuit 130 can be configured to analyze the audio source signal waveform from the audio signal source device 101. The processor circuit 130 can identify or predict a zero-crossing of the source signal waveform and can time an attenuation network circuit 120 change to temporally coincide with the zero-crossing. By coordinating an attenuation network circuit 120 update with a zero-crossing, audible artifacts (e.g., clicking or popping sounds) in the output signal can be avoided. In an example, an attenuation change can be forced without a zero-crossing event, such as when some maximum interval is exceeded after an attenuation change instruction is received.

In the discussion of FIG. 1 above, various operating characteristics associated with the attenuation device 110 were discussed, including a device sensitivity characteristic, a hysteresis characteristic, an audio signal compression characteristic, and an audio signal frequency filter characteristic. Any one or more of these characteristics can be updated or implemented using the processor circuit 130 to coordinate a change in the attenuation network circuit 120, or in some other signal processing module in the audio signal path in the attenuation device 110.

The system illustrated in FIG. 2 optionally includes an external device 150 that can be communicatively coupled with the attenuation device 110. A wireless communication link 145, such as an RF link, can be used to exchange information between the external device 150 and a wireless communication circuit 140 in the attenuation device 110. In an example, the external device 150 includes an environment sensor that can be located remotely from the attenuation device 110. For example, the environment sensor in the external device 150 can be included in a mobile telephone, and the information from the environment sensor in the mobile telephone can be communicated to the processor circuit 130 for use by way of the wireless communication circuit 140. In an example, an interface on the external device 150 (e.g., a touchscreen on the mobile telephone) can be used to update or adjust one or more characteristics of the attenuation device 110.

The attenuation device 110 can include a power source, such as a battery 117 (e.g., rechargeable or replaceable). In some examples, the attenuation device 110 operates using several milliamps, and can function for about 100 hours or more using one or more single-cell "coin" batteries. In an example, the attenuation device 110 can draw all or a portion of its operating power from a power source in one of the audio signal source device 101 or in the audio signal output destination device 102. For example, the attenuation device 110 can draw power from a microphone terminal at the audio signal source device 101. In an example, the attenuation device 110 can harvest all or a portion of its operating power from the audio signal received from the audio signal source device 101. For example, when the audio signal at the audio input 111 includes an amplitude (e.g., peak, RMS, or other amplitude characteristic) that meets or exceeds some specified threshold amplitude, the attenuation device 110 can harvest or store a portion of that signal for use in powering at least a portion of the attenuation device 110 itself. Harvested energy can optionally be used to supplement or to re-charge a battery included with the attenuation device 110 (e.g., the battery 117 in the example of FIG. 2).

Figure 3:
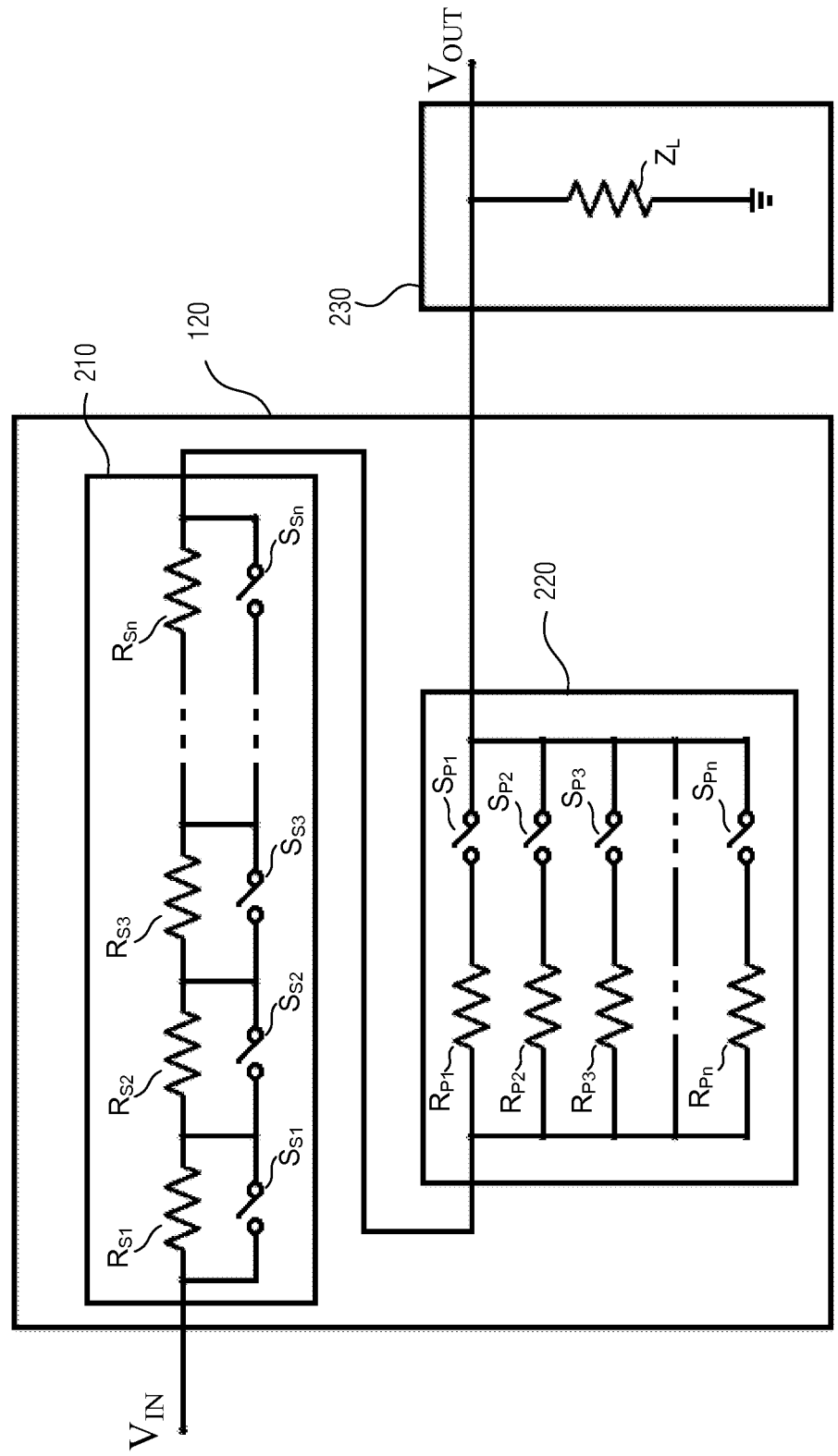
FIG. 3 illustrates generally an example of an attenuation network circuit.

FIG. 3 illustrates generally an example of the attenuation network circuit 120. The attenuation network circuit 120 can include multiple passive resistive devices that can be selectively introduced to the audio signal path to change an attenuation magnitude characteristic of the circuit. In an example, the resistive devices can be configured such that, when operated in coordination under the direction of the processor circuit 130, the devices can provide a range of attenuation magnitude profiles, such as including an attenuation interval resolution of about 1 dB.

The attenuation network circuit 120 includes a first resistive network 210 that includes multiple, series-connected resistive devices ($R_{S1}$, $R_{S2}$, $R_{S3}$, . . . $R_{Sn}$). Multiple switching devices ($S_{S1}$, $S_{S2}$, $S_{S3}$, . . . $S_{Sn}$) can be associated with, and electrically coupled to, respective ones of the series-connected resistive devices. Each of the switching devices can be configured to selectively shunt a corresponding one of the series-connected resistive devices, such as in response to an instruction from the processor circuit 130 to change a resistance characteristic of the attenuation network circuit 120. For example, when the first switching device $S_{S1}$ is closed in response to a signal from the processor circuit 130, the resistance provided by $R_{S1}$ is removed from the signal path between $V_{IN}$ and $V_{OUT}$ in the attenuation network circuit 120. If a switch associated with a specified series resistive device is closed, the resistance of that portion of the resistive network corresponding to the specified series resistive device is shorted out by the switch. If the switch is opened, the resistance of that section of the network will be equal to that of the corresponding series resistive device.

The attenuation network circuit 120 includes a second resistive network 220 that includes multiple, parallel-connected resistive devices ($R_{P1}$, $R_{P2}$, $R_{P3}$, . . . $R_{Pn}$). Multiple switching devices ($S_{P1}$, $S_{P2}$, $S_{P3}$, . . . $S_{Pn}$) can be associated with, and electrically coupled to, respective ones of the parallel-connected resistive devices. Each of the switching devices can be configured to selectively remove a corresponding one of the parallel-connected resistive devices from the audio signal path, such as in response to an instruction from the processor circuit 130 to change a resistance characteristic of the attenuation network circuit 120. For example, when the first switching device $S_{P1}$ is opened, the resistance provided by $R_{P1}$ is removed from the signal path between $V_{IN}$ and $V_{OUT}$ in the attenuation network circuit 120.

In an example, a number of pairs of resistive devices and switches in the first and second resistive networks 210 and 220 can be selected for use in a particular application. That is, more or fewer of the resistive devices can be selected for use, such as depending on the desired range of attenuation, or how fine the attenuation increments are. The number of resistive elements in the first and second resistive networks 210 and 220 can be the same or different.

In an example, one or more MOSFET devices can be used to implement the switches in FIG. 3 (e.g. the series-connected switches $S_{S1}$, $S_{S2}$, $S_{S3}$, . . . $S_{Sn}$, or the parallel-connected switches $S_{P1}$, $S_{P2}$, $S_{P3}$, . . . $S_{Pn}$). A MOSFET device can have a low "on" resistance, and a current required to control a MOSFET switch can be small, thereby reducing demand on the battery 117. Other switching devices can alternatively or additionally be used, including other semiconductor-based devices such as FET devices, BJT devices, or MEMS devices.

The total resistance of the attenuation network circuit 120 in FIG. 3 includes the series-parallel combination $R_{NW}$ of all of the resistive devices that are "enabled" or present in the signal path between $V_{IN}$ and $V_{OUT}$. The total resistance $R_{NW}$ can be computed as the sum of the series-connected resistive devices ($R_{S1}$, $R_{S2}$, $R_{S3}$, . . . $R_{Sn}$) and the parallel-connected resistive devices ($R_{P1}$, $R_{P2}$, $R_{P3}$, . . . $R_{Pn}$) that are in the circuit path at any time. In Equations 1 and 2, below, each resistance value is preceded by a coefficient $S_{XX}$. $S_{XX}$ has a value "1" if the corresponding switch is closed, and $S_{XX}$ has a value "0" if the corresponding switch is open.

$$R_S = S_{S1}R_{S1} + S_{S2}R_{S2} + \ldots + S_{Sn}R_{Sn} \quad (1)$$

$$R_P = \frac{1}{S_{P1}/R_{P1} + S_{P2}/R_{P2} + \ldots + S_{Pn}/R_{Pn}} \quad (2)$$

$$R_{NW} = R_S + R_P \quad (3)$$

The resulting attenuation ratio ($V_{IN}$ divided by $V_{OUT}$) of the network can be computed using the effective load ($Z_L$) at the output 230 and the value of $R_{NW}$. That is, $$\frac{V_{IN}}{V_{OUT}} = \frac{Z_L + R_{NW}}{Z_L} \quad (4)$$

By selecting appropriate values of the series-connected resistive devices ($R_{S1}$, $R_{S2}$, $R_{S3}$, ... $R_{Sn}$) and the parallel-connected resistive devices ($R_{P1}$, $R_{P2}$, $R_{P3}$, ... $R_{Pn}$), a large range of $R_{NW}$ values can be achieved using a minimum number of components, such as by opening or closing the appropriate switches in the first and second resistive networks 210 and 220. In some examples, embedded microcontroller output pins of the processor circuit 130 can be used to control the switches. That is, one or more output signals from the processor circuit 130 (e.g., from respective microcontroller output pins) can be used to open or close the switches based on the analysis of environment parameter and/or a user input.

In an example, only the second resistive network 220, including the parallel-connected resistive devices ($R_{P1}$, $R_{P2}$, $R_{P3}$, ... $R_{Pn}$), is used to provide the $R_{NW}$ to satisfy a particular application. In this example, the switches ($S_{S1}$, $S_{S2}$, $S_{S3}$, ... $S_{Sn}$) in the first resistive network 210 can all be closed, effectively shunting the first resistive network 210. If only the first resistive network 210 is used to provide the desired $R_{NW}$, then a switch (e.g., $S_{P2}$) associated with a resistive device (e.g., $R_{P2}$) in the second resistive network 220 (e.g., having a resistance of about 0 ohms) can be closed, any other switches in the second resistive network 220 can be open, and the second resistive network 220 can be conceptually replaced with a single wire. In some examples, both of the first and second resistive networks 210 and 220 can be used in a cascaded manner, such as shown in the example of FIG. 3. This cascaded configuration can be most efficient for providing sufficiently small attenuation intervals given overall circuit size and component count constraints.

In some applications, at least one of the switches in the second resistive network 220 can be closed. If all of the parallel-connected switches ($S_{P1}$, $S_{P2}$, $S_{P3}$, ... $S_{Pn}$) in the second resistive network 220 are open, then the attenuation network circuit 120 will be open and no audio signal will be permitted to pass through the attenuation device 110. In some cases, it can be useful to create an open circuit in the network, such as can be provided by opening all of the parallel resistive network switches. One reason to open the network is to inhibit an audio signal from passing through the attenuation device 110, thereby muting the device. Another reason to open the network is to remove any stray impedance or signal components from the circuit so as to enable more accurate detection of an input device.

The operating speed of the switches $S_n$ in the attenuation network circuit 120 can be selected based on a power consumption budget and a user tolerance for potential artifacts in the audio output signal. If the operating speed is too low, audible "click" sounds can potentially be heard in the audio output signal when one or more of the switches are operated to change an attenuation magnitude characteristic of the circuit. As the operating speed of the switches increases, however, more power can be consumed at each switching event. Generally, switching times of around 1 µs sufficiently minimize audible artifacts and maintain sufficient battery life.

Figure 4:
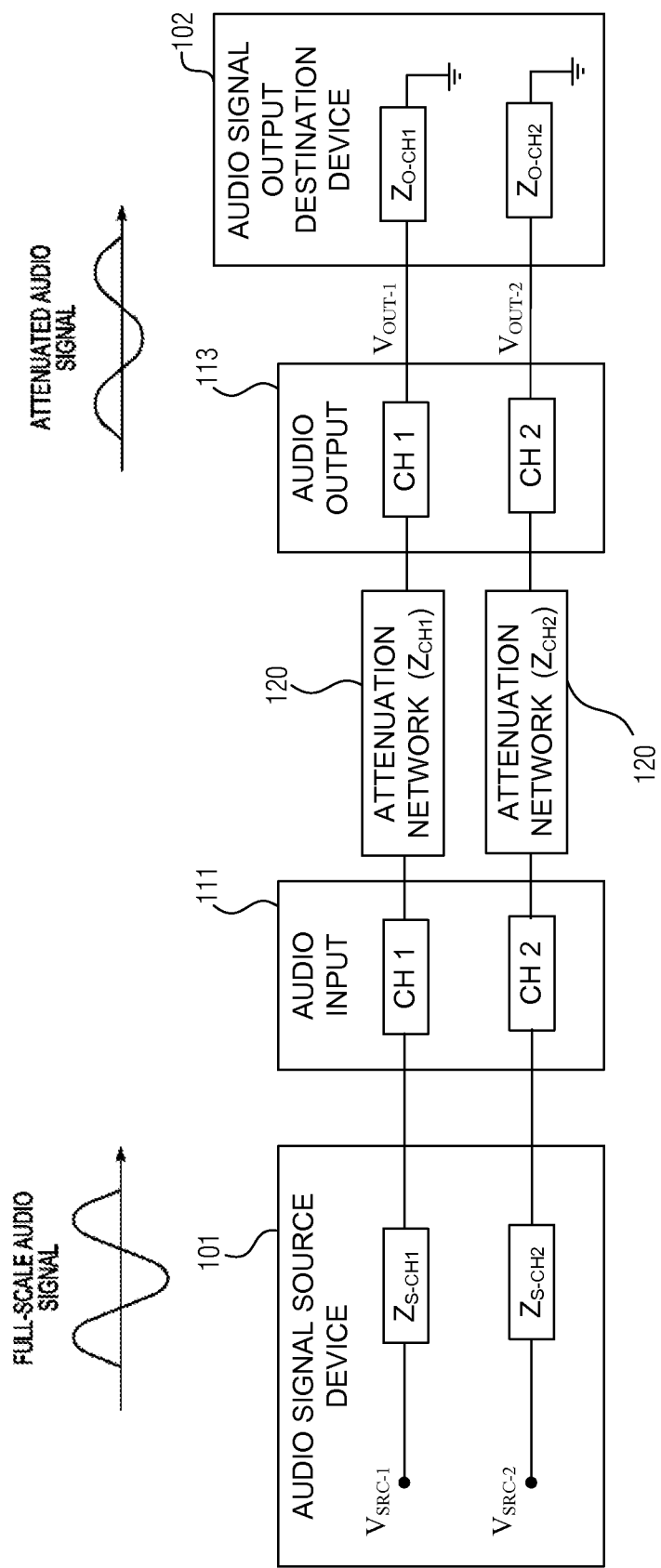
FIG. 4 illustrates generally an example of a multiple channel automatic attenuation device.

FIG. 4 illustrates generally an example of a multiple channel application of the attenuation device 110. The audio signal source device 101 includes internal impedances ($Z_{S\text{-}CH1}$ and $Z_{S\text{-}CH2}$) that correspond respectively to each of two signal channels CH1 and CH2 (e.g., left and right audio channels in a stereo system). Each channel can have a corresponding attenuation network having an adjustable characteristic impedance (e.g., $Z_{CH1}$ and $Z_{CH2}$). The overall attenuation of the system illustrated in FIG. 4 can be based on a channel-specific output impedance (e.g., $Z_{O\text{-}CH1}$ and $Z_{O\text{-}CH2}$) and the impedance, $Z_{CH1}$ or $Z_{CH2}$, of the corresponding attenuation network. The respective output voltages at each channel (e.g., the voltage at each of two channels of the audio signal output destination device 102), $V_{OUT\text{-}1}$ and $V_{OUT\text{-}2}$, are functions of the corresponding channel input voltages from the audio signal source device, $V_{SRC\text{-}1}$ and $V_{SRC\text{-}2}$, and the various system impedances. For example, for the first channel CH1:

$$V_{OUT\text{-}1} = V_{SRC\text{-}1} \frac{Z_{O\text{-}CH1}}{Z_{S\text{-}CH1} + Z_{CH1} + Z_{O\text{-}CH1}} \quad (5)$$

and for the second channel CH2:

$$V_{OUT\text{-}2} = V_{SRC\text{-}2} \frac{Z_{O\text{-}CH2}}{Z_{S\text{-}CH2} + Z_{CH2} + Z_{O\text{-}CH2}} \quad (6)$$

In an example, the attenuation network circuit 120 can be updated periodically, such as at regular intervals using information from the processor circuit 130. In another example, the attenuation network circuit 120 can be updated in response to an event, such as identified using the processor circuit 130, that indicates a change in the attenuation network circuit 120 is needed, such as in response to a change in the sensed information about the environment parameter from the environment sensor 115. In some examples, the processor circuit 130 is configured to update an attenuation magnitude characteristic of the attenuation network circuit 120 only when the output device sensor 114 indicates that the audio signal output destination device 102 is coupled to the audio output 113. In some examples, the processor circuit 130 is configured to update an attenuation magnitude characteristic of the attenuation network circuit 120 only when the input device sensor 112 indicates that the audio signal source device 101 is coupled to the audio input 111.

Figure 5:
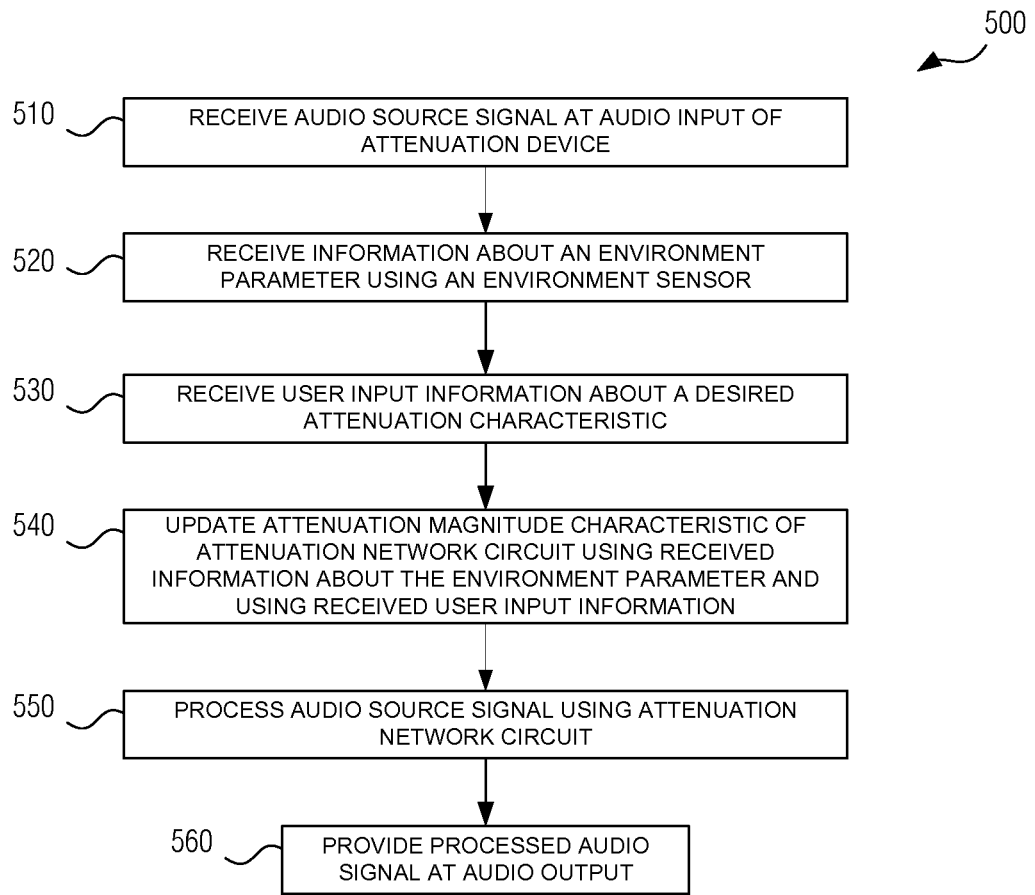
FIG. 5 illustrates generally an example of a method that can include processing an audio source signal using an attenuation network circuit.

FIG. 5 illustrates generally an example of a method 500 that can include processing an audio source signal using the attenuation network circuit 120. At 510, the example includes receiving an audio source signal at an audio signal input, such as at the audio input 111 of the attenuation device 110. The audio source signal received at 510 can be digital or analog, and can be received using a wired or wireless transmission medium. The maximum volume, frequency content, or other characteristic of the audio source signal received at 510 can optionally be determined using the audio signal source device 101 that supplies the audio source signal. In an example, receiving the audio source signal at 510 includes determining whether the audio signal source device 101 is electrically coupled to the audio input 111 of the attenuation device 110.

At 520, the method can include receiving information about an environment parameter using the environment sensor 115. The environment sensor 115 can be coupled to or contained within a portion of the attenuation device 110, or the environment sensor 115 can be remotely located from the attenuation device 110 and configured to provide the sensed information to the attenuation device 110. In an example, the environment sensor 115 is integrated with the body of the attenuation device 110, and the attenuation device 110 is sized and shaped to be used in an open-air environment, such as outside of a user's pocket, so that the environment sensor 115 can receive or sense information about the environment in which the attenuation device 110 is used. In an example, the attenuation device 110 includes a clip, strap, or other mechanism for attaching the attenuation device 110 to a person's clothing or body. The attachment mechanism can be configured such that, when the attenuation device 110 is attached to the person's clothing or body, the environment sensor 115 is oriented in a preferred manner to receive the environment parameter information.

In an example, the environment sensor 115 includes one or more passive or active microphone elements or other transducers that are configured to receive sound pressure level information and provide one or more corresponding electrical signals. The environment sensor 115 can include one or more passive or active frequency filters to process the received sound pressure level information, such as before the signal indicative of the sensed environment parameter is processed using another portion of the attenuation device 110. In an example, the environment sensor 115 includes an array of microphone elements, or the environment sensor 115 includes at least one microphone element that is positioned remotely from the housing of the attenuation device 110. For example, at least one microphone element can be positioned on a headphone cable or at or near an earpiece of a headphone. At 520, receiving the information about the environment parameter can include receiving or sensing a sound pressure level using a microphone and, in response, providing a signal indicative of the sensed environment parameter to the processor circuit 130.

In an example, the environment sensor 115 can additionally or alternatively include a position sensing device, such as a GPS receiver, that is configured to receive information about a location of the attenuation device 110 and provide one or more corresponding electrical signals. At 520, receiving the information about the environment parameter can include receiving the location information and, in response, providing a signal indicative of the received location information to the processor circuit 130.

In an example, the environment sensor 115 can additionally or alternatively include an optical or visual sensor that is configured to receive or sense visual information about an environment surrounding the sensor. For example, the optical or visual sensor can be taught to recognize multiple different environments based on the content, light quality, or other characteristic corresponding to a specific one of the different environments. At 520, receiving the information about the environment parameter can include receiving the visual information and, in response, providing a signal indicative of the sensed environment parameter to the processor circuit 130.

In an example, the environment sensor 115 can include an accelerometer that is configured to receive or sense acceleration or motion information about the attenuation device 110. At 520, receiving the information about the environment parameter can include receiving the acceleration or motion information and, in response, providing a signal indicative of the sensed environment parameter to the processor circuit 130.

At 530, the method 500 includes receiving user input information about a desired attenuation characteristic. The desired attenuation characteristic can be applied to the audio source signal received at 510. Receiving the user input information at 530 can include receiving information from a user about a relative attenuation magnitude desired by the user in response to a given environment parameter characteristic, such as in response to a particular sensed noise or ambient sound pressure level. Receiving the user input information at 530 can additionally or alternatively include receiving information from a user about a desired sensitivity characteristic of the environment sensor 115. For example, when the environment sensor 115 includes a microphone, the sensitivity of the microphone can be adjusted at 530 in response to a user input.

At 540, the method 500 includes updating an attenuation magnitude characteristic of the attenuation network circuit 120, such as using the received information about the environment parameter and using the received user input information. Updating the attenuation magnitude characteristic includes maintaining or changing a status of one or more of the resistors or switches in the attenuation network circuit 120. For example, updating the attenuation magnitude characteristic can include changing a resistance characteristic of the attenuation network circuit 120 by opening or closing one or more of the multiple switching devices ($S_{S1}$, $S_{S2}$, $S_{S3}$, ... $S_{Sn}$) associated with the series-connected resistive devices and the multiple switching devices ($S_{P1}$, $S_{P2}$, $S_{P3}$, ... $S_{Pn}$) associated with the parallel-connected resistive devices.

Once the attenuation magnitude characteristic of the attenuation network circuit 120 is completed, the method 500 continues at 550 with processing the audio source signal using the attenuation network circuit 120. At 560, the processed audio source signal is provided at the audio output 113.

In an example, the received information about the environment parameter includes information about an ambient sound pressure level, and the received user input information includes information about a desired attenuation magnitude characteristic of the attenuation device 110. In this example, the desired attenuation magnitude characteristic corresponds to a maximum attenuation magnitude of the attenuation device 110. In operation, in response to a first sensed ambient sound pressure level that indicates a low level of background noise, updating the attenuation magnitude characteristic at 540 includes opening all of the switches in the first resistive network 210 and closing one switch in the second resistive network 220 in the attenuation network circuit 120. The single switch in the second resistive network 220 can correspond to one of the parallel-connected resistive devices ($R_{P1}$, $R_{P2}$, $R_{P3}$, ... $R_{Pn}$) having the greatest resistance. In this manner, all of the series-connected resistive devices ($R_{S1}$, $R_{S2}$, $R_{S3}$, ... $R_{Sn}$) and the one of the parallel-connected resistive devices ($R_{P1}$, $R_{P2}$, $R_{P3}$, ... $R_{Pn}$) having the greatest resistance are inserted into the signal path between $V_{IN}$ and $V_{OUT}$, thereby providing a maximum level of signal attenuation to the audio source signal. In response to a second sensed ambient sound pressure level that indicates a high level of background noise, updating the attenuation magnitude characteristic at 540 includes closing or opening one or more of the switches in the first and second resistive networks 210 and 220 to reduce the level of signal attenuation, and thereby to pass the audio source signal with a greater amplitude from $V_{IN}$ to $V_{OUT}$.

In an example, in response to a first sensed ambient sound pressure level, the response of the attenuation network circuit 120 can vary according to the sensitivity of the microphone, such as received at 530. That is, when the microphone is configured for greater sensitivity, the attenuation network circuit 120 can apply a first lesser level of attenuation in response to a first input signal, and when the microphone is configured for less sensitivity, the attenuation network circuit 120 can apply a second greater level of attenuation in response to the same first input signal.

Figure 6:
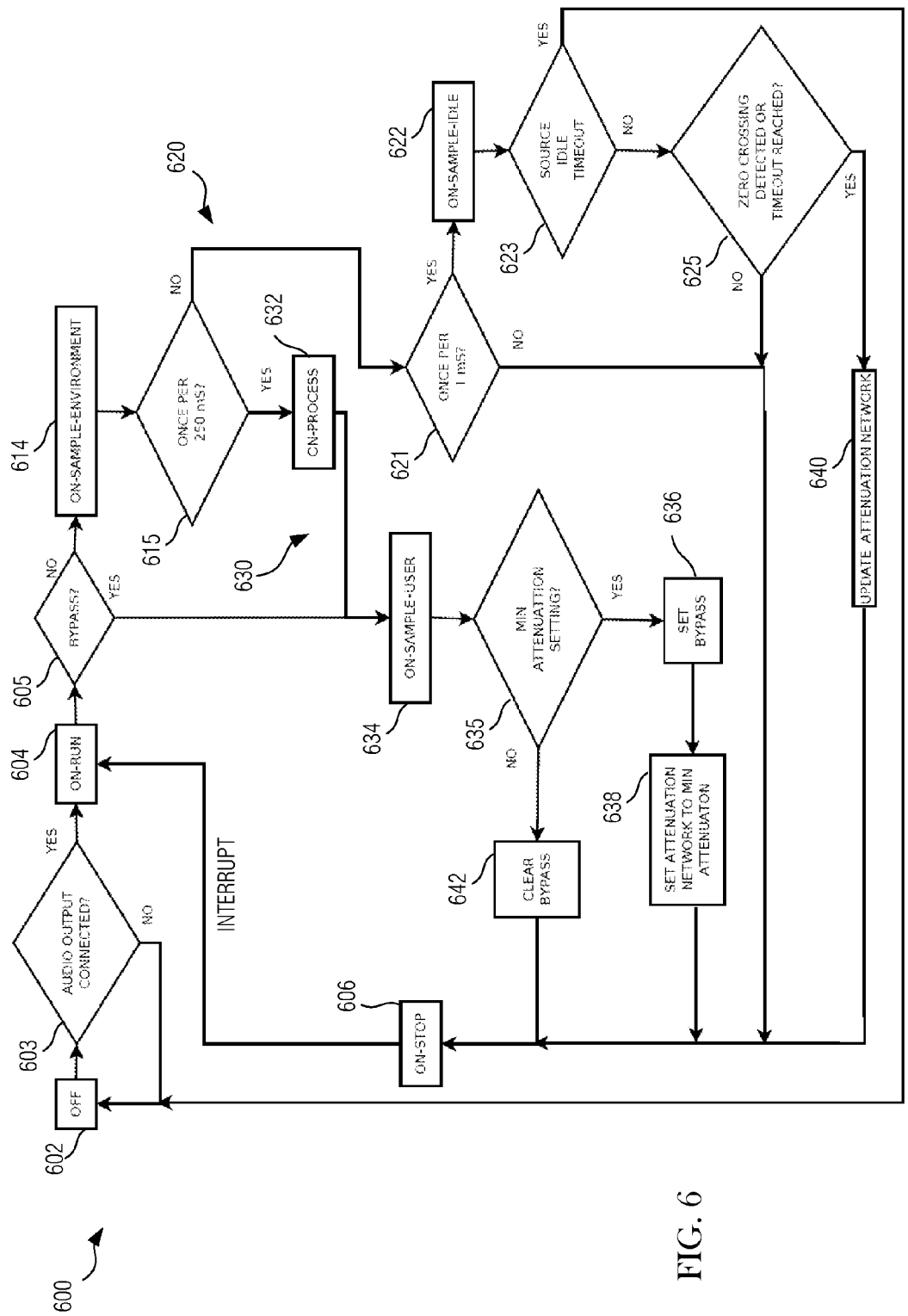
FIG. 6 illustrates generally a state diagram for an automatic signal attenuation device.

FIG. 6 illustrates generally a state diagram 600 for an automatic signal attenuation device, such as the attenuation device 110. At 602, an OFF state corresponds to the attenuation device 110 in an off state in which little or zero power is consumed. In some examples, the attenuation device 110 includes an on-off switch coupled in series with the battery 117 and, in the off position, the power signal path is physically open and no current can flow. In an example, the OFF state is automatically entered when the audio signal source device 101 or the audio signal output destination device 102 is decoupled or unplugged from the attenuation device 110. In the OFF state, the equivalent resistance of each of the first and second resistive networks 210 and 220 can be set to a high value, and substantially no signal is passed through the attenuation network circuit 120.

At 604, an ON-RUN state can be entered. In an example, the ON-RUN state is entered in response to at least one of power being applied, an audio output device being connected, or a periodic interrupt. At 603, the attenuation device 110 can be configured to determine whether an audio output device is connected, such as using the output device sensor 114. If no audio output device is connected, then the device can return to the OFF state 602. The audio output connection check can optionally be implemented using hardware, software, or some combination of hardware and software.

In an example, the processor circuit 130 can enter an ON-STOP state 606 when the processor circuit 130 is not actively monitoring the device inputs and is not actively adjusting the attenuation network 120. In the ON-STOP state 606, the processor circuit 130 can operate in a low power mode, including any processor cycle during which no computation or instruction is received or provided by the processor circuit 130. In the ON-STOP state 606, the attenuation network circuit 120 can maintain a specified resistance or impedance characteristic, such as for processing an audio signal based on a user setting.

In the example of FIG. 6, at 605, the processor circuit 130 can determine whether a BYPASS flag is set. If the BYPASS flag is set, then the ON-SAMPLE-USER state 634 is entered (see below at 630). If the BYPASS flag is not set, then the ON-SAMPLE-ENVIRONMENT state 614 is entered. At 614, corresponding to the ON-SAMPLE-ENVIRONMENT state, the processor circuit 130 can be configured to read or sample a value (e.g., from an ADC circuit portion of the processor circuit 130) associated with the environment sensor 115. For example, when the environment sensor 115 includes a microphone, the processor circuit 130 can sample the microphone output in the ON-SAMPLE-ENVIRONMENT state 614.

In the ON-SAMPLE-ENVIRONMENT state 614, the processor circuit 130 can coordinate an environment parameter sample event. In an example, the processor circuit 130 gathers information about the present environment parameter sample event and multiple previous environment parameter sample events, such as to compile a moving average of the environment parameter value. Using multiple environment parameter values, erroneous or outlier data points can be identified and discarded from a larger environment parameter data set. A moving average can be used for a number of sensor inputs in order to assist in minimizing the effect of erroneous or outlier data points. Based on the sensed environment parameter, and optionally based on multiple previous sensed environment parameters, the processor circuit 130 can coordinate an update of the attenuation network circuit 120, such as described above in the example 500 at 540.

The processor circuit 130 can be configured to process information received (e.g., received at the ON-SAMPLE-ENVIRONMENT state 614) multiple times per second, such as four times per second, or one time every 250 ms. The number of cycles or updates per second can be selected based on a design compromise between variables such as power consumption and user tolerance for a "lag" between a change in the environment and implementation of an attenuation update.

At 615, the processor circuit 130 can identify a portion of a process cycle. Depending on the identified portion of the cycle, the processor circuit 130 can determine whether to proceed with an idling or time-out sequence 620 or to proceed with a sample processing sequence 630.

In the example of FIG. 6, the idling or time-out sequence 620 can include, at 621, determining whether a specified interval has elapsed since a previous update. The specified interval is 1 ms in the example of FIG. 6, however, other intervals can be used. If the 1 ms period has not elapsed, then the processor circuit 130 can proceed to the ON-STOP state 606. If the 1 ms period has elapsed, then the method can proceed to the ON-SAMPLE-IDLE state 622.

In the ON-SAMPLE-IDLE state 622, the processor circuit 130 can coordinate a sample event, including sampling an amplitude of an audio signal, such as at the audio input 111. In an example, sampling the amplitude includes using the processor circuit 130 to send a request for a voltage level sample to the input device sensor 112. After the sample event, the example proceeds to 623 to determine whether a timeout duration has elapsed. At 623, if the audio input 111 fails to detect a signal having greater than some specified threshold amplitude, such as during the specified timeout duration, then the example 600 can return to the OFF state 602. Power can optionally be removed from the processor circuit 130 when the example returns to the OFF state 602. If, however, the audio input 111 detects a signal having greater than the specified threshold amplitude, such as during the specified timeout duration, then the example 600 can continue at 625 with further analysis.

At 625, information about the audio signal can be analyzed. In an example, at 625, the processor circuit 130 can identify or predict a zero crossing of the audio signal. That is, the processor circuit 130 can be configured to identify an actual or an expected timing of a zero or near-zero crossing of the audio signal, such as at the audio input 111. If a zero crossing is identified, then the method can continue at 640 with updating an attenuation network, such as including the attenuation network circuit 120. The attenuation network update at 640 can be temporally coordinated with an identified zero crossing (or a predicted zero crossing) to minimize any audible switching artifacts in the output signal. In an example, after the update at 640, the example can return to the ON-STOP state 606.

At 640, the example 600 refers to updating an attenuation magnitude characteristic of the attenuation network circuit 120. As described herein, however, one or more other signal processing functions can be performed, such as alternatively or additionally to the attenuation update at 640. For example, at 640, the example can optionally include changing one or more of an attenuation update attack rate, an attenuation update release rate, an attenuation hysteresis characteristic, an audio signal compression ratio, or a loudness or other frequency characteristic of the audio signal.

At 625, a second timeout duration can be provided. In an example, if a zero crossing is not identified within the second timeout duration, and the second timeout duration elapses, then the method can continue at 640 with updating an attenuation network. If, at 625, a zero crossing is not identified, and the second timeout duration is not elapsed, then the method can continue to ON-STOP at 606.

In the example of FIG. 6, the sample processing sequence 630 can continue from the process cycle determination at 615. At 632, for example, the example can include an ON-PROCESS state 632. During the ON-PROCESS state at 632, the processor circuit 130 can sample one or more of the user input 103, the input device sensor 112, the output device sensor 114, or an audio signal (e.g., at the audio input 111 or elsewhere) itself.

At 634, the example includes an ON-SAMPLE-USER state during which the user input 103 can be sampled. At 635, information about the user input 103 can be analyzed, such as using the processor circuit 130, to determine whether the user input 103 indicates a minimum attenuation setting. If, at 635, a minimum attenuation setting is indicated, then the BYPASS flag can be set at 636, the attenuation network can be adjusted at 638 to a minimum attenuation characteristic (e.g., the resistive network in the attenuation network circuit 120 can be adjusted to provide no resistance), and the example can continue to the ON-STOP state 606. If, at 635, a minimum attenuation setting is not indicated, then the method can continue at 642 with clearing a BYPASS flag, if any, and proceeding to the ON-STOP state 606. From the ON-STOP state at 606, the processor circuit 130 can remain in a low power state until the circuit receives an interrupt or wake-up. In an example, the interrupt can occur periodically, such as about every 125 μs.

Notes & Examples

Example 1 can include or use subject matter (such as an apparatus, a method, a means for performing acts, or a device readable medium including instructions that, when performed by the device, can cause the device to perform acts), such as can include or use an apparatus including an audio signal input, an audio signal output, and an environment sensor configured to sense an environment parameter. Example 1 can include an attenuation network coupled to the audio signal input and the audio signal output, and the attenuation network can be configured to receive a source signal from the audio signal input and to provide an attenuated signal, based on the source signal, to the audio signal output. Example 1 can include a first processor circuit configured to update an attenuation magnitude characteristic of the attenuation network using information about the sensed environment parameter.

Example 2 can include, or can optionally be combined with the subject matter of Example 1, to include a microphone as the environment sensor configured to sense the environment parameter. The microphone can be configured to sense an ambient sound pressure level as the environment parameter, and the first processor circuit can be configured to update the attenuation magnitude characteristic of the attenuation network based on the sensed ambient sound pressure level.

Example 3 can include, or can optionally be combined with the subject matter of Example 2, to include a rectifier configured to receive information from the microphone and in response provide, to the first processor circuit, a rectified signal indicative of a magnitude of the ambient sound pressure level.

Example 4 can include, or can optionally be combined with the subject matter of one or any combination of Examples 1 through 3 to include a user input configured to receive information from a user about a desired microphone sensitivity characteristic of the microphone. In Example 4, the first processor circuit can be configured to update the attenuation magnitude characteristic of the attenuation network using the information about the sensed environment parameter and using the received information from the user about the desired microphone sensitivity characteristic. In Example 4, the user input can include a hardware input device or a software-implemented input interface feature that is movable by the user between at least two positions, and the user input can include different non-numerical indicia that indicate different microphone sensitivity characteristics and are in visual correspondence with the at least two positions.

Example 5 can include, or can optionally be combined with the subject matter of one or any combination of Examples 1 through 4 to optionally include a user input configured to receive information from a user about a desired attenuation magnitude characteristic. In Example 5, the first processor circuit can be configured to update the attenuation magnitude characteristic of the attenuation network using the information about the sensed environment parameter and using the received information from the user about the desired attenuation magnitude characteristic.

Example 6 can include, or can optionally be combined with the subject matter of Example 5, to include, as the user input, a hardware input device that is movable by the user between at least two physical positions.

Example 7 can include, or can optionally be combined with the subject matter of Example 5, to include, as the user input, a hardware input device or a software-implemented input interface feature that is movable by the user between at least two positions, and the user input can include different non-numerical indicia that are indicative of different attenuation magnitude characteristics and are in visual correspondence with the at least two positions.

Example 8 can include, or can optionally be combined with the subject matter of Example 5, to include, as the user input, a data input that wirelessly receives user input information from a mobile electronic device.

Example 9 can include, or can optionally be combined with the subject matter of one or any combination of Examples 1 through 8 to optionally include multiple resistive devices in the attenuation network. In Example 9, each resistive device can be selectively actuated by a corresponding switching device to modify the attenuation magnitude characteristic of the attenuation network.

Example 10 can include, or can optionally be combined with the subject matter of one or any combination of Examples 1 through 9 to optionally include, in the attenuation network, a first resistive network having multiple series-connected resistive devices, and each series-connected resistive device can have an associated switching device that is configured to selectively shunt its associated series-connected resistive device in response to an instruction from the first processor circuit to change a resistance characteristic of the first resistive network. Example 10 can include, in the attenuation network, a second resistive network having multiple parallel-connected resistive devices, and each parallel-connected resistive device can have an associated switching device that is configured to selectively decouple its associated parallel-connected resistive device in response to a different instruction from the first processor circuit to change a resistance characteristic of the second resistive network. In Example 10, the first and second resistive networks can be electrically coupled in series, one of the first and second resistive networks can be coupled to the audio signal input, and the other one of the first and second resistive networks is coupled to the audio signal output.

Example 11 can include, or can optionally be combined with the subject matter of Example 10, to include, as the switching devices in the first and second resistive networks, one or more of field effect transistors, BJT transistors, or other switch circuits.

Example 12 can include, or can optionally be combined with the subject matter of one or any combination of Examples 1 through 11 to optionally include the first processor circuit configured to identify a zero-crossing of an audio signal at the audio signal input and, in response and within a specified duration, change the attenuation magnitude characteristic of the attenuation network.

Example 13 can include, or can optionally be combined with the subject matter of one or any combination of Examples 1 through 12 to optionally include the first processor circuit configured to update the attenuation magnitude characteristic of the attenuation network at least about every 250 milliseconds.

Example 14 can include, or can optionally be combined with the subject matter of one or any combination of Examples 1 through 13 to optionally include an output device sensor at the audio signal output, and the output device sensor can be configured to sense whether an output device is coupled to the audio signal output. In Example 14, the first processor circuit can be configured to intermittently update the attenuation magnitude characteristic of the attenuation network only when the output device sensor indicates that an output device is coupled to the audio signal output.

Example 15 can include, or can optionally be combined with the subject matter of one or any combination of Examples 1 through 14 to optionally include a source device sensor at the audio signal input. The source device sensor can be configured to sense whether a source device is coupled to the audio signal input. In Example 15, the first processor circuit can be configured to intermittently update the attenuation magnitude characteristic of the attenuation network only when the source device sensor indicates that a source device is coupled to the audio signal input.

Example 16 can include, or can optionally be combined with the subject matter of Example 15, to optionally include the source device sensor configured to indicate that a source device is absent from the audio signal input when a magnitude of an electrical signal detected at the audio signal input is less than a specified electrical signal magnitude for greater than a specified duration.

Example 17 can include, or can optionally be combined with the subject matter of one or any combination of Examples 1 through 16 to optionally include a hysteresis control circuit that is configured to inhibit, for a specified duration and in response to a specified change in the sensed environment parameter, the first processor circuit from updating the attenuation magnitude characteristic of the attenuation network.

Example 18 can include, or can optionally be combined with the subject matter of one or any combination of Examples 1 through 17 to optionally include a user input configured to receive information from a user about one or more of an attenuation update attack rate, an attenuation update release rate, an attenuation hysteresis characteristic, an audio signal compression ratio, a loudness or equalization characteristic, an environment parameter sensitivity characteristic, and an audio source signal type.

Example 19 can include, or can optionally be combined with the subject matter of one or any combination of Examples 1 through 18 to optionally include, as the environment sensor configured to sense the environment parameter, at least one of a microphone configured to sense information about an ambient sound pressure level in the vicinity of the apparatus, a GPS receiver configured to sense information about a location of the apparatus, an optical sensor configured to sense visual information about an environment, and an accelerometer configured to sense motion of the apparatus.

Example 20 can include, or can optionally be combined with the subject matter of one or any combination of Examples 1 through 19 to optionally include, as at least one of the audio signal input and the audio signal output, a digital audio interface.

Example 21 can include or use subject matter (such as an apparatus, a method, a means for performing acts, or a device readable medium including instructions that, when performed by the device, can cause the device to perform acts), such as can include receiving an audio source signal at an audio signal input, receiving, at a processor circuit, information about an ambient audible noise level using an environment sensor, receiving, at the processor circuit, information about a user input that is indicative of a desired attenuation characteristic, automatically updating, using the processor circuit, an attenuation magnitude characteristic of an attenuation network using the received information about the user input and the received information about the ambient audible noise level, processing the received audio source signal using the attenuation network, and providing an attenuated output signal, based on the audio source signal, at an audio signal output.

Example 22 can include, or can optionally be combined with the subject matter of Example 21, to include determining whether a playback device is coupled to an output of the personal listening device. In Example 22, automatically updating the attenuation magnitude characteristic of the attenuation network can include only when the playback device is determined to be coupled to the output of the personal listening device, to conserve battery life in a battery that is configured to supply a power signal to the processor circuit.

Example 23 can include, or can optionally be combined with the subject matter of one or any combination of Examples 21 or 22 include receiving the information about the ambient audible noise level using a microphone.

Example 24 can include, or can optionally be combined with the subject matter of one or any combination of Examples 21 through 23 to include receiving the information about the ambient audible noise level, including receiving an indication of an average or RMS sound pressure level over a specified duration.

Example 25 can include, or can optionally be combined with the subject matter of one or any combination of Examples 21 through 24 to include receiving the information about the user input that is indicative of a desired attenuation characteristic, including wirelessly receiving the information from a mobile electronic device.

Example 26 can include, or can optionally be combined with the subject matter of one or any combination of Examples 21 through 25 to optionally include automatically updating the attenuation magnitude characteristic of the attenuation network, including selectively operating multiple switches, and each of the switches corresponds to respective resistive elements in an audio signal path between the audio signal input and the audio signal output.

Example 27 can include, or can optionally be combined with the subject matter of one or any combination of Examples 21 through 26 to optionally include detecting a zero crossing of the audio source signal, and in response to the detected zero crossing, triggering the automatic updating of the attenuation magnitude characteristic of the attenuation network.

Example 28 can include, or can optionally be combined with the subject matter of one or any combination of Examples 21 through 27 to optionally include receiving, at the processor circuit, information about a changed ambient sound pressure level using information from the environment sensor. When the information about the changed ambient sound pressure level indicates greater than a specified threshold increase in the ambient sound pressure level, Example 28 can include automatically decreasing the attenuation magnitude of the attenuation network. When the information about the changed ambient sound pressure level indicates greater than a specified threshold decrease in the ambient sound pressure level, Example 28 can include automatically increasing the attenuation magnitude of the attenuation network.

Example 29 can include or use subject matter (such as an apparatus, a method, a means for performing acts, or a device readable medium including instructions that, when performed by the device, can cause the device to perform acts), such as can include or use a mobile audio processing device, including an audio signal input configured to receive an audio source signal, an audio signal output configured to provide an audio output signal based on the audio source signal, a microphone configured to receive information about an ambient sound pressure level, a processor circuit, a serial arrangement of passive resistive components in an audio signal path between the audio signal input and the audio signal output, a parallel arrangement of passive resistive components, electrically coupled to the serial arrangement of passive resistive devices and in the audio signal path, and a plurality of switching devices (e.g., semiconductor-based or other switches). In Example 29, each switching device can be electrically coupled to an associated one of the passive resistive components in one of the serial and parallel arrangements of passive resistive components, and each switching device can be configured to modify an attenuation characteristic of the mobile audio processing device. In Example 29, the processor circuit can be configured to operate the plurality of switching devices using information from the microphone about the ambient sound pressure level and using information from a user input about a desired attenuation magnitude.

Example 30 can include, or can optionally be combined with the subject matter of Example 29, to include a user interface display that is configured to receive, from the user, the user input about the desired attenuation magnitude.

Example 31 can include, or can optionally be combined with the subject matter of one or any combination of Examples 1 through 30 to optionally include an energy harvesting circuit that can be coupled to the audio signal input. The energy harvesting circuit can be configured to harvest a power signal from the source signal at the audio signal input and supply the harvested power signal to one or both of the processor circuit and the attenuation network, for example, for use in operating one or more switching devices.

Example 32 can include, or can optionally be combined with the subject matter of one or any combination of Examples 1 through 31 to optionally include an energy harvesting circuit that can be coupled to a microphone terminal of a source device, and the source device is coupled to the audio signal input. The energy harvesting circuit can be configured to harvest a power signal from the microphone terminal and supply the harvested power signal to one or both of the processor circuit and the attenuation network, for example, for use in operating one or more switching devices.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

In the claims, the terms "including" and "comprising" are open-ended, that is, a system, device, article, composition, formulation, or process that includes elements in addition to those listed after such a term in a claim are still deemed to fall within the scope of that claim. Moreover, in the claims, the terms "first," "second," and "third," etc. are used merely as labels, and are not intended to impose numerical requirements on their objects.

What is claimed is:

1. An apparatus, comprising:
   an audio signal input;
   an audio signal output;
   an environment sensor configured to sense an environment parameter;
   an attenuation network coupled to the audio signal input and the audio signal output, the attenuation network configured to receive a source signal from the audio signal input and to provide an attenuated signal, based on the source signal, to the audio signal output; and
   a first processor circuit configured to update an attenuation magnitude characteristic of the attenuation network using information about the sensed environment parameter;
   wherein the attenuation network comprises:
      a first resistive network comprising a plurality of series-connected resistive devices, each series-connected resistive device having an associated switching device that is configured to selectively shunt its associated series-connected resistive device in response to an instruction from the first processor circuit to change a resistance characteristic of the first resistive network; and
      a second resistive network comprising a plurality of parallel-connected resistive devices, each parallel-connected resistive device having an associated switching device that is configured to selectively decouple its associated parallel-connected resistive device in response to a different instruction from the first processor circuit to change a resistance characteristic of the second resistive network;
      wherein the first and second resistive networks are electrically coupled in series; and
      wherein one of the first and second resistive networks is coupled to the audio signal input, and the other one of the first and second resistive networks is coupled to the audio signal output.

2. The apparatus of claim 1, wherein the environment sensor configured to sense the environment parameter includes a microphone configured to sense an ambient sound pressure level as the environment parameter, and wherein the first processor circuit is configured to update the attenuation magnitude characteristic of the attenuation network based on the sensed ambient sound pressure level.

3. The apparatus of claim 2, comprising a rectifier configured to receive information from the microphone and in response provide, to the first processor circuit, a rectified signal indicative of a magnitude of the ambient sound pressure level.

4. The apparatus of claim 2, comprising a user input configured to receive information from a user about a desired microphone sensitivity characteristic of the microphone, and wherein the first processor circuit is configured to update the attenuation magnitude characteristic of the attenuation network using the information about the sensed environment parameter and using the received information from the user about the desired microphone sensitivity characteristic;
   wherein the user input includes a hardware input device or a software-implemented input interface feature that is movable by the user between at least two positions, and the user input includes multiple different indicia that indicate different microphone sensitivity characteristics and are in visual correspondence with the at least two positions.

5. The apparatus of claim 1, comprising a user input configured to receive information from a user about a desired attenuation magnitude characteristic, and wherein the first processor circuit is configured to update the attenuation magnitude characteristic of the attenuation network using the information about the sensed environment parameter and using the received information from the user about the desired attenuation magnitude characteristic.

6. The apparatus of claim 5, wherein the user input includes a hardware input device that is movable by the user between at least two physical positions.

7. The apparatus of claim 5, wherein:
   the user input includes a hardware input device or a software-implemented input interface feature that is movable by the user between at least two positions, and
   the user input includes multiple different indicia that indicate different attenuation magnitude characteristics and are in visual correspondence with the at least two positions.

8. The apparatus of claim 1, wherein the first processor circuit is configured to identify a zero-crossing of an audio signal at the audio signal input and, in response and within a specified duration, change the attenuation magnitude characteristic of the attenuation network.

9. The apparatus of claim 1, comprising an output device sensor at the audio signal output, the output device sensor configured to sense whether an output device is coupled to the audio signal output;
   wherein the first processor circuit is configured to intermittently update the attenuation magnitude characteristic of the attenuation network only when the output device sensor indicates that an output device is coupled to the audio signal output.

10. The apparatus of claim 1, comprising a source device sensor at the audio signal input, the source device sensor configured to sense whether a source device is coupled to the audio signal input;
    wherein the first processor circuit is configured to intermittently update the attenuation magnitude characteristic of the attenuation network only when the source device sensor indicates that a source device is coupled to the audio signal input.

11. The apparatus of claim 1, wherein the processor circuit comprises a hysteresis control circuit that is configured to inhibit, for a specified duration and in response to a specified change in the sensed environment parameter, the first processor circuit from updating the attenuation magnitude characteristic of the attenuation network.

12. The apparatus of claim 1, including an energy harvesting circuit coupled to at least one of the audio signal input or a microphone terminal of a source device that is coupled to the audio signal input, the energy harvesting circuit configured to:
    harvest a power signal from the source signal at the audio signal input or from the microphone terminal; and
    supply the harvested power signal to at least one of the first processor circuit and the attenuation network.

13. A method for automatically adjusting an audio signal amplitude for a personal listening device, the method comprising:

receiving an audio source signal at an audio signal input;

receiving, at a processor circuit, information about an ambient audible noise level using an environment sensor;

receiving, at the processor circuit, information about a user input that is indicative of a desired attenuation characteristic;

automatically updating, using the processor circuit, an attenuation magnitude characteristic of an attenuation network using the received information about the user input and the received information about the ambient audible noise level;

processing the received audio source signal using the attenuation network; and providing an attenuated output signal, based on the audio source signal, at an audio signal output;

wherein the automatically updating the attenuation magnitude characteristic of the attenuation network includes:

in a first resistive network comprising a plurality of series-connected resistive devices and first switching devices respectively corresponding to each of the series-connected resistive devices, shunting selected ones of the series-connected resistive devices, using one or more of the first switching devices, in response to an instruction from the processor circuit to change a resistance characteristic of the first resistive network; and in a second resistive network comprising a plurality of parallel-connected resistive devices and second switching devices respectively corresponding to each of the parallel-connected resistive devices, decoupling selected ones of the parallel-connected resistive devices, using one or more of the second switching devices, in response to a different instruction from the processor circuit to change a resistance characteristic of the second resistive network;

wherein the first and second resistive networks are electrically coupled in series; and wherein one of the first and second resistive networks is coupled to the audio signal input, and the other one of the first and second resistive networks is coupled to the audio signal output.

14. The method of claim 13, comprising determining whether a playback device is coupled to an output of the personal listening device, and wherein the automatically updating the attenuation magnitude characteristic of the attenuation network includes only when the playback device is determined to be coupled to the output of the personal listening device, to conserve battery life in a battery that is configured to supply a power signal to the processor circuit.

15. The method of claim 13, comprising:

detecting a zero crossing of the audio source signal; and in response to the detected zero crossing, triggering the automatic updating of the attenuation magnitude characteristic of the attenuation network.

16. The method of claim 13, comprising:

receiving, at the processor circuit, information about a changed ambient sound pressure level using information from the environment sensor; and when the information about the changed ambient sound pressure level indicates greater than a specified threshold increase in the ambient sound pressure level, automatically decreasing the attenuation magnitude of the attenuation network, and when the information about the changed ambient sound pressure level indicates greater than a specified threshold decrease in the ambient sound pressure level, automatically increasing the attenuation magnitude of the attenuation network.

17. A mobile audio processing device, comprising:

an audio signal input configured to receive an audio source signal;

an audio signal output configured to provide an audio output signal based on the audio source signal;

a microphone configured to receive information about an ambient sound pressure level;

a processor circuit; and an attenuation network including:

a first resistive network comprising a plurality of series-connected resistive devices, each series-connected resistive device having an associated switching device that is configured to selectively shunt its associated series-connected resistive device in response to a first instruction from the first processor circuit to change a resistance characteristic of the first resistive network; and a second resistive network comprising a plurality of parallel-connected resistive devices, each parallel-connected resistive device having an associated switching device that is configured to selectively decouple its associated parallel-connected resistive device in response to a second instruction from the first processor circuit to change a resistance characteristic of the second resistive network;

wherein the first and second resistive networks are electrically coupled in series; and wherein one of the first and second resistive networks is coupled to the audio signal input, and the other one of the first and second resistive networks is coupled to the audio signal output;

wherein the processor circuit is configured to provide the first and second instructions to the switching devices using information from the microphone about the ambient sound pressure level and using information from a user input about a desired attenuation magnitude.

18. The mobile audio processing device of claim 17, comprising a user interface display that is configured to receive, from the user, the user input about the desired attenuation magnitude.

19. The method of claim 13, wherein the receiving the information about the ambient audible noise level includes receiving sound pressure level information from a microphone, and wherein the automatically updating the attenuation magnitude characteristic of the attenuation network includes using the received sound pressure level information.

20. The method of claim 14, further comprising periodically updating the attenuation magnitude characteristic of the attenuation network when the playback device is determined to be coupled to the output of the personal listening device.

21. The method of claim 13, further comprising using a hysteresis control circuit, inhibiting the automatically updating the attenuation magnitude characteristic of the attenuation network for a specified duration and in response to a specified change in the received information about the ambient audible noise level.

* * * * *